United States Patent [19]
Schrock

[11] Patent Number: 5,861,678
[45] Date of Patent: Jan. 19, 1999

[54] METHOD AND SYSTEM FOR ATTACHING SEMICONDUCTOR DICE TO SUBSTRATES

[75] Inventor: Ed A. Schrock, Boise, Id.

[73] Assignee: Micron Technology, Inc., Boise, Id.

[21] Appl. No.: 997,350

[22] Filed: Dec. 23, 1997

[51] Int. Cl.[6] ............................ H01L 23/48; H01L 23/52; H01L 29/40

[52] U.S. Cl. .......................... 257/783; 257/782; 257/778; 257/780

[58] Field of Search ................................. 257/782, 783, 257/780, 781, 779; 438/118

[56] References Cited

U.S. PATENT DOCUMENTS

| | | | |
|---|---|---|---|
| 4,899,921 | 2/1990 | Bendat et al. | 228/105 |
| 5,001,542 | 3/1991 | Tsukagoshi et al. | 257/783 |
| 5,317,191 | 5/1994 | Abe | 257/782 |
| 5,550,408 | 8/1996 | Kunitomo et al. | 257/783 |
| 5,691,567 | 11/1997 | Lo et al. | 257/783 |

OTHER PUBLICATIONS

Tummala, Rao R., *Microelectronics Packaging Handbook*, pp. 366–369, 1989.

"Output™ 315", Loctite Corporation, product description sheet, Rocky Hill, CT, Dec. 1996.

VARIDOT™ Surface Mount Adhesive Printing Process, Loctite Corporation, Rocky Hill, CT, advertising brochure.

O'Connor, John T. et al., Recent Breakthrough in Thermal Resistant Cyanoacrylate Instant Adhesives, techical paper, Society of Manufacturing Engineers, Sep. 14–16, 1993.

Millet, George H., "Properties of Cyanoacrylates—an Overview", *Adhesives Age,* Oct. 1981, pp. 27–32.

Melody, David P., "Advances in Room Temperature Curing Adhesives and Sealants—A Review", *British Polymer Journal,* vol. 21, No. 2, 1989, pp. 175–179.

*Primary Examiner*—Carl Whitehead, Jr.
*Assistant Examiner*—S. V. Clark
*Attorney, Agent, or Firm*—Stephen A. Gratton

[57] ABSTRACT

A method for attaching bumped semiconductor dice to substrates, such as printed circuit boards and multi chip modules, is provided. The method includes the steps of: providing an instant curing adhesive formulated to cure within 0.25 to 60 seconds, and dispensing a volume of the adhesive onto the substrate. The method also includes the steps of heating the die, and aligning the contact bumps on the die to the contacts on the substrate. Following these steps the die can be brought into contact with the substrate to form an adhesive layer therebetween. Heat from the die cures the adhesive layer. In addition, the cured adhesive layer tensions the die against the substrate, and compresses the contact bumps and contacts to form low resistance electrical connections. A system for performing the method includes a lead-on-chip die attacher configured to heat the die, to dispense the adhesive, to align the die and substrate, and then to press the die against the substrate with a desired pressure.

34 Claims, 3 Drawing Sheets

METHOD AND SYSTEM FOR ATTACHING SEMICONDUCTOR DICE TO SUBSTRATES

FIELD OF THE INVENTION

This invention relates generally to semiconductor packaging and more particularly to an improved system and method for attaching semiconductor dice to substrates, such as printed circuit boards.

BACKGROUND OF THE INVENTION

One type of semiconductor die, referred to as a "bumped" die, includes patterns of contact bumps formed on a face of the die. The contact bumps can be formed on wettable metal contacts on the die in electrical communication with the integrated circuits contained on the die. The contact bumps allow the die to be "flip chip" mounted to a substrate having corresponding solder wettable contacts. This mounting process was originally developed by IBM and is also known as the C4 joining process (Controlled Collapse Chip Connection).

Lead tin alloys (e.g., 95/5 lead tin alloy) and a ball limiting metallurgy (BLM) process can be used to form the bumps. Typically, the bumps are dome shaped, and have an average diameter of from 5 mils to 30 mils. Micro ball grid arrays (BGA) are formed in the smaller range, while standard ball grid arrays are formed in the larger size range. The sides of the bumps typically bow or curve outwardly from flat top surfaces. The flat top surfaces of the bumps form the actual regions of contact with the mating contacts on the substrate.

FIGS. 1A–1C illustrate a prior art flip chip mounting process. In FIG. 1A a bumped semiconductor die 10 includes a pattern of contact bumps 12 arranged in a desired pattern 14. As shown in FIG. 1B, the die 10 also includes a passivation layer 18 and contacts 16 for the bumps 12. The contacts 16 are in electrical communication with the semiconductor devices and integrated circuits formed on the die 10.

Each bump 12 can be formed on a corresponding contact 16. In addition, each bump 12 can include a stack of underlying layers 20a–c. By way of example, layer 20a can be an adherence layer (e.g., Cr), layer 20b can be a solderable layer (e.g., Cu) and layer 20c can be a flash layer (e.g., Au). The bumps 12 can be formed by processes that are known in the art such as ball limiting metallurgy (BLM). Typically, the bumps 12 comprise an alloy such as lead/tin or nickel/palladium.

In FIG. 1C the die 10 has been flip chip mounted to a substrate 22. The substrate 22 includes solder wettable contacts 24 embedded in a glass layer 26. During the flip chip mounting process the contact bumps 12 (FIG. 1B) on the die 10 are aligned and placed in physical contact with the contacts 24 on the substrate 22. This can be accomplished with an optical alignment device such as an aligner bonder tool. A flux can be placed on the substrate as a temporary adhesive to hold the die 10 in place on the substrate 22.

The temporary assembly is then subjected to a reflow thermal cycle using a heat source directed at the die 10 or an oven which heats the entire assembly. This melts the contact bumps 12 (FIG. 1B) and forms reflowed contact bumps 12RF. The reflowed contact bumps 12RF bond the contacts 24 on the substrate 22 to the contacts 16 on the die 10. In addition, the reflowed contact bumps 12RF provide separate electrical and heat conductive paths for the die 10.

In some applications an underfill layer 28 can be formed between the die 10 and the substrate 22. The underfill layer 28 seals the gap between the die 10 and substrate 22. In addition, the underfill layer 28 can include a heat conductive material, such as silver balls, to improve heat transfer from the die 10.

With flip chip mounting the physical attachment of the die 10 to the substrate 22 is formed by the reflowed contact bumps 12RF. In general, the reflowed contact bumps 12RF are relatively small in total area so that the attachment force is relatively low. In addition, the reflowed contact bumps 12RF can crack during subsequent usage of the substrate 22. This can loosen the die 10 and increase the electrical resistivity of the electrical paths between the die 10 and substrate 22.

Also during the flip chip mounting process, the die 10 must be held in place while the reflowed contact bumps 12RF harden from the molten state. Shifting of the die 10 during hardening of the reflowed contact bumps 12RF, can weaken the attachment forces between the die 10 and substrate 22. Still further, the die 10 must be pressed against the substrate 22 with a required pressure during the flip chip mounting pressure. This pressure also affects the subsequent attachment force. If the pressure is low or uneven the attachment force can also be low and uneven.

In view of the above limitations of conventional flip chip mounting processes, the present invention is directed to an improved system and method for attaching semiconductor dice to substrates.

SUMMARY OF THE INVENTION

In accordance with the present invention, an improved method and system for attaching semiconductor dice to substrates are provided. The method includes the steps of: heating a bumped die to soften contact bumps thereon; applying an instant curing adhesive to a die mounting area of the substrate; aligning the contact bumps with contacts on the substrate; pressing the die against the die mounting area with a desired pressure; and then curing the adhesive with the heated die to form a cured adhesive layer.

Following curing of the adhesive layer, the reflowed contact bumps harden and bond to the contacts on the substrate. Shrinkage of the adhesive layer during curing places tension forces on the die, and compresses the reflowed contact bumps against the contacts. The tension forces facilitate bonding of the contact bumps to the contacts, and lower the electrical resistivity of the resultant connections. In addition, the adhesive layer permanently attaches the die to the substrate, and eliminates the need for an underfill layer between the die and substrate.

Preferably the adhesive comprises an epoxy, such as a bismaleimide resin, which is curable in seconds at a temperature of from 100°–300° C. One suitable material comprises a conductive epoxy in which conductive silver particles are replaced with non-conductive Teflon particles. In addition, the contacts on the substrate can be formed as bumps of a conductive material such as a conductive polymer.

The system comprises a conventional lead-on-chip die attacher modified to align and place the die and substrate in contact. The substrate can include indexing holes to facilitate the alignment process. In addition, the system can include a heating mechanism for heating the die, and a dispensing mechanism for dispensing the adhesive on the die mounting area of the substrate. The system can also include a die pressing mechanism configured to press the die against the adhesive with a desired amount of pressure.

The method and system of the invention can be used to provide an improved electronic assembly. The assembly comprises: a substrate with patterns of contacts thereon; a plurality of bumped semiconductor dice having contact bumps bonded to the contacts on the substrate; and cured adhesive layers attaching the dice to the substrate.

DETAILED DESCRIPTION OF THE PREFERRED EMBODIMENTS

Figure 2:
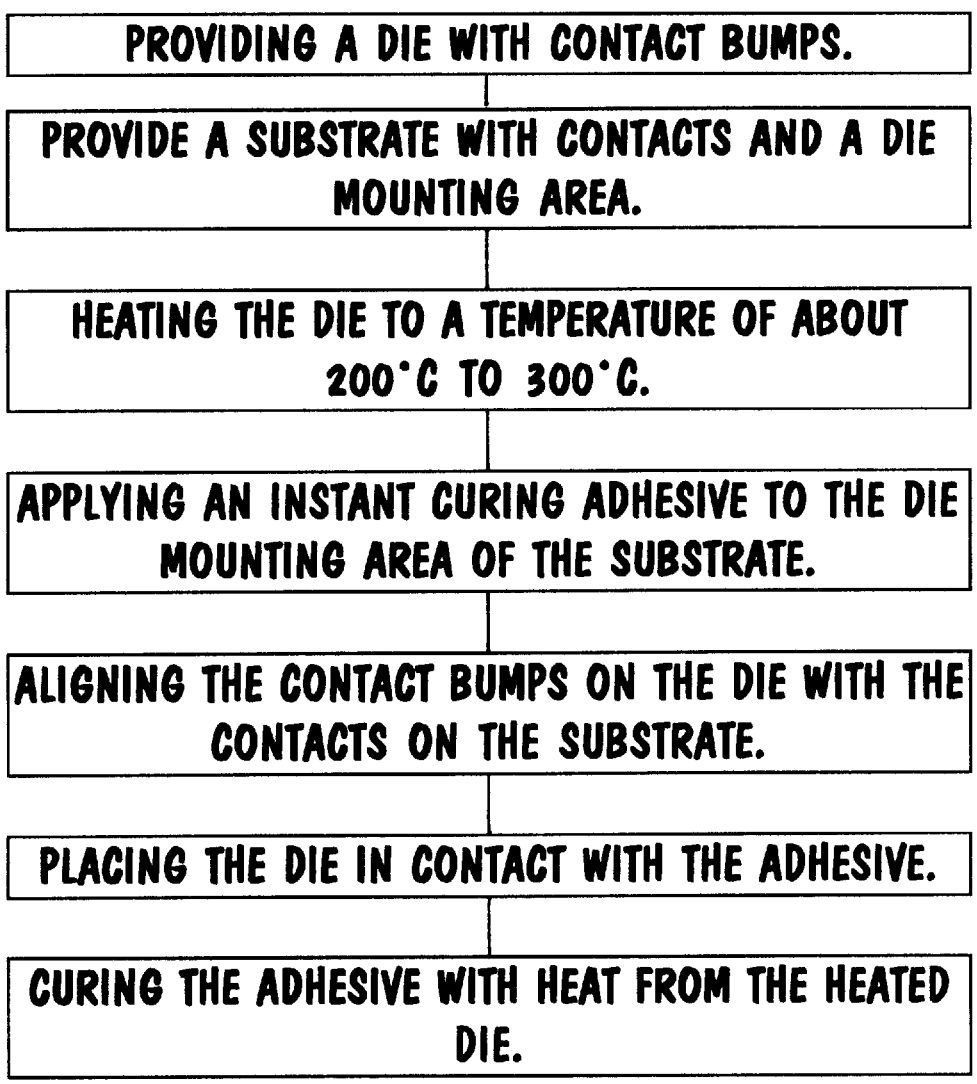
FIG. 2 is a block diagram illustrating broad steps in the method of the invention.

Referring to FIG. 2, a method for attaching a die to a substrate in accordance with the invention includes the steps of:

Providing a die with contact bumps.

Providing a substrate with contacts and a die mounting area.

Heating the die to a temperature of about 100° C. to 300° C.

Applying an instant curing adhesive to the die mounting area of the substrate.

Aligning the contact bumps on the die with the contacts on the substrate.

Placing the die in contact with the adhesive.

Curing the adhesive with heat from the heated die.

Figure 1A:
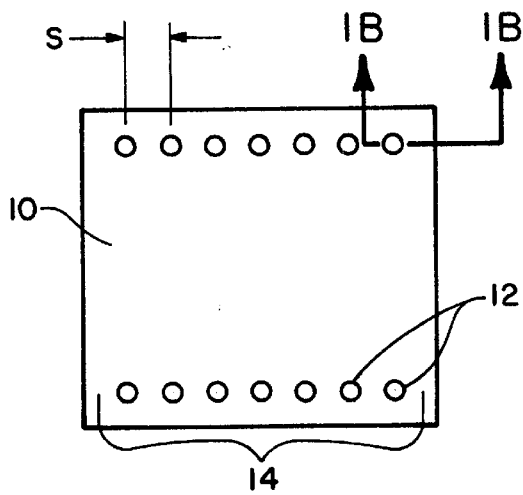
FIG. 1A is a plan view of a prior art bumped semiconductor die including contact bumps arranged in a ball grid array (BGA)

Initially, a bumped die with contact bumps arranged in a desired pattern is provided. The bumped die can be a conventional bump die such as the die 10 shown in FIG. 1A. The die 10 (FIG. 1A) includes contact bumps 12 formed in pattern 14 along the lateral edges of the die 10. Alternately, the contact bumps 12 can be formed in patterns along the end edges of the die 10, or in patterns along the center portion of the die 10. The contact bumps 12 can also be formed in a dense pattern, such as a ball grid array (BGA).

Figure 1B:
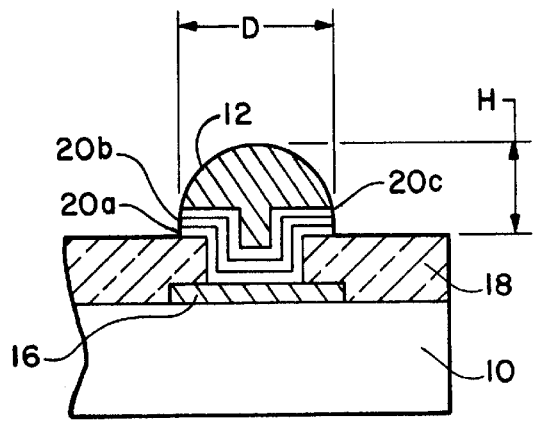
FIG. 1B is an enlarged cross sectional view of a prior art contact bump taken along section line 1B—1B of FIG. 1A.
Figure 1C:
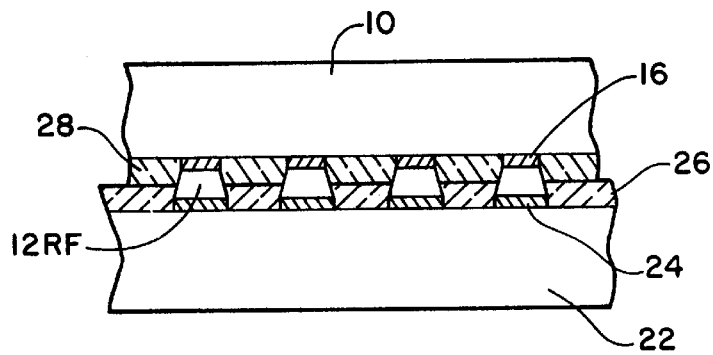
FIG. 1C is an enlarged cross sectional view of the bumped die attached to a substrate with a prior art flip chip mounting method.

The contact bumps 12 can be formed substantially as previously described and shown in FIG. 1B. Preferably the contact bumps 12 comprise a solder alloy. Exemplary solder alloys include: 95%Pb/5%Sn, 60% Pb/40%Sn, 63%In/37%Sn, 100%Sn, 62%Pb/36%Sn/2%Au, or 67%Ni/33%Pd. Alternately the contact bumps 12 can comprise a conductive elastomer such as a "z-axis anisotropic adhesive".

Figure 3A:
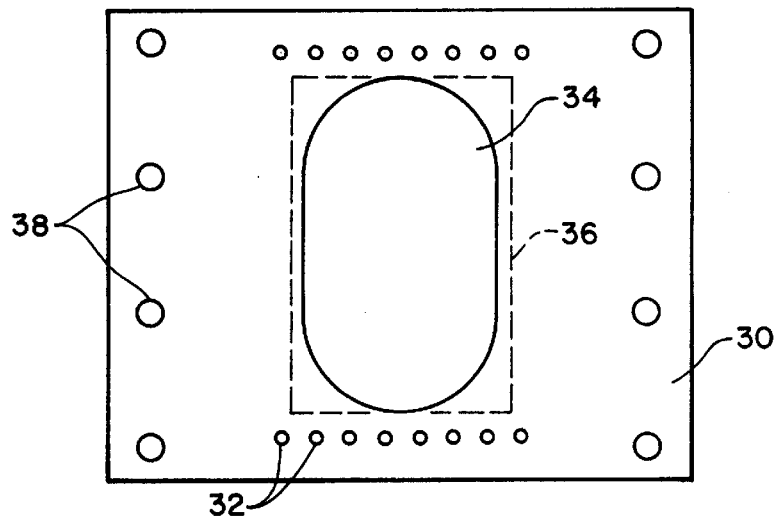
FIG. 3A is a schematic plan view of a substrate having an instant cure epoxy deposited onto a die mounting area thereof.

In addition to the die 10, a substrate 30 (FIG. 3A) is provided. In the illustrative embodiment, the substrate 30 comprises an electrically insulating material, such as FR-4 or ceramic. By way of example, the substrate 30 can be provided in the configuration of a printed circuit board (PCB), or in the configuration of a multi-chip-module (MCM). As shown in FIG. 3A, the substrate 30 includes contacts 32 arranged in patterns corresponding to the patterns 14 (FIG. 1A) of the contact bumps 12 (FIG. 1A) on the die 10. The contacts 32 are in electrical communication with conductive traces (not shown) and other circuit elements (not shown) formed on the substrate 30, as required. In addition, the substrate 30 can include indexing openings 38 along opposite longitudinal edges thereof.

Figure 3B:
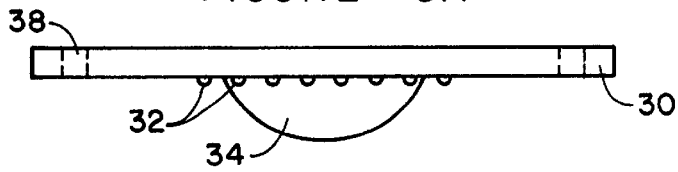
FIG. 3B is a side elevation view of FIG. 3A.

In the embodiment shown in FIGS. 3A and 3B, the contacts 32 comprise raised members formed with a desired diameter, spacing and height. The diameter and spacing of the contacts 32 can be substantially equal to a diameter and spacing of the contact bumps 12 on the die 10. This diameter and spacing will typically be in a range of from about 3 mils to 30 mils. For example, with the die 10 having contact bumps 12 in the configuration of a micro BGA, the contacts 32 can be formed with a diameter "D" between about 4 mils to 6 mils and a spacing "S" between about 3 mils to 10 mils. A height "H" of the contacts 32 can be between about 3 mils to 5 mils. Alternately, rather than being formed as raised members, the contacts 32 can comprise planar and recessed pads in a desired shape (e.g., square, rectangular, circular, oval etc.).

The contacts 32 can comprise a solder wettable metal or a solder wettable conductive elastomer. Exemplary metals for the contacts 32 include aluminum, copper, gold, palladium and tantalum. Exemplary conductive elastomers for the contacts 32 include z-axis anisotropic adhesives such as "Z-POXY", by A. I. Technology, Trenton, N.J.; and "SHELL-ZAC", by Sheldahl, Northfield, Minn.

Following providing of the die 10 and substrate 30, the die 10 can be heated to a temperature of between about 100° C. to 300° C. The heating step can be performed using a conductive heating mechanism (e.g., heating block) or a convection heating mechanism (e.g., oven). Heating of the die 10 softens the contact bumps 12, and provides energy for curing an adhesive layer 40 (FIG. 4B) between the die 10 and the substrate 30. In addition, heating of the die 10 provides energy for bonding the contact bumps 12 on the die 10 to the contacts 12 on the substrate 30. Preferably, the heating step softens but does not liquefy the contact bumps 12.

Following the heating step, and as shown in FIGS. 3A and 3B, an instant curing adhesive 34 can be applied to a die mounting area 36 of the substrate 30. As used herein, the term "instant curing adhesive" and "snap curing adhesive", refer to an adhesive material formulated to form adhesive bonds at a temperature of between about 100° C. to 300° C. within 0.25 seconds to 60 seconds, and at ambient atmosphere. As used herein, a "cured" material refers to a material wherein from 90% to 100% of the material has cured to form adhesive bonds.

Preferably, the instant curing adhesive 34 comprises an electrically insulating epoxy that can be dispensed in a viscous form. One suitable instant curing adhesive 34 comprises a bismaleimide resin with a dielectric filler (e.g., "TEFLON" balls), available from Quantum Materials, Inc. of San Diego, Calif., under the trademark "BN 1139". Another suitable instant curing adhesive comprises a cyanoacrylate monomer commercially available from Loctite Corporation, Rocky Hill, Conn. under the trademarks "410" or "416".

In FIGS. 3A and 3B, the adhesive 34 has been applied as a glob of material having a desired volume. Alternately, the adhesive 34 can be applied as a pattern of dots or lines. The adhesive 34 can be applied by any suitable in-line dispensing mechanism including syringe dispensing, stenciling, dip coating, spraying, and dot shooting mechanisms. A volume of the adhesive 34 will depend on the size of the die 10 and the desired thickness of an adhesive layer 40 (FIG. 4B). A representative volume of adhesive 34, for a 4 mm×8 mm die can be from 0.001 grams to 0.002 grams.

Figure 4A:
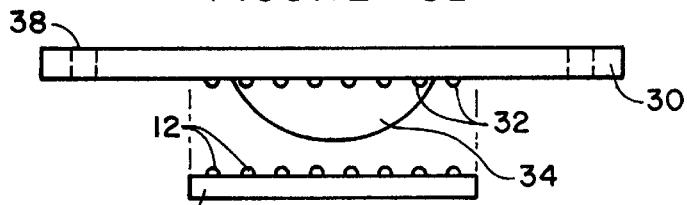
FIG. 4A is a schematic side view of the substrate and die during an alignment step.
Figure 4B:
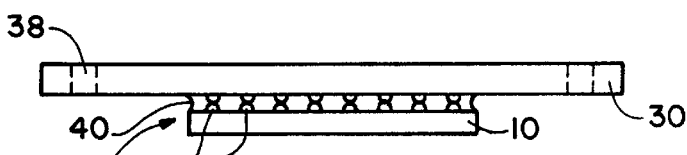
FIG. 4B is a schematic cross sectional view of the completed assembly.

Referring to FIG. 4A, following applying of the adhesive 34 to the substrate 30, the contact bumps 12 on the die 10 can be aligned with the contacts 32 on the substrate 30. The alignment step can be performed using mechanical or optical alignment techniques. With mechanical alignment techniques, indexing and guiding mechanisms can be used to align the substrate 30 to the die 10. For example, die attachers configured to bond semiconductor dice to leadframes, include mechanical alignment mechanisms that can be used to perform the alignment step of the present method. In the illustrative embodiment, the substrate 30 includes alignment openings 38 operable in conjunction with the die attach system 42 (FIG. 5) to be hereinafter described.

With optical alignment, a split optics device can be used to view the contacts 32 and substrate 30, and to provide input for moving the substrate 30, or the die 10, as required, to achieve the necessary alignment. Optical alignment techniques are routinely employed in flip chip bonding of semiconductor dice to substrates. For example, an aligner bonder tool, is disclosed in U.S. Pat. No. 4,899,921, to Bendat et al. Aligner bonder tools are also available from Research Devices, Inc. of Piscataway, N.J.

The alignment step is facilitated as the contact bumps 12 on the die 10 are placed into contact with the contacts 32 on the substrate 30. Specifically, with the contact bumps 12 formed of solder and the contacts 32 formed of a solder wettable material, the solder will be attracted to the contacts 32. Contact bumps 12 formed of solder are therefore self-aligning. Preferably the contact bumps 12 are in a semi-solid state such that the solder does not flow onto undesired areas of the substrate 30.

Referring to FIG. 4B, following the alignment step, the die 10 can be placed into contact with the adhesive 34. In the illustrative embodiment, the placing step can be performed using the die attach system 42 (FIG. 5) to be hereinafter described. The placing step can also be performed using an aligner bonder tool as previously described.

Preferably, the die 10 is pressed against the adhesive 34 with a controlled amount of pressure. A representative pressure can be from about 5 grams to about 6 kilo grams. With the die 10 pressed against the adhesive 34, curing of the adhesive forms an adhesive layer 40. In general, curing of the adhesive 34 results from heat transfer from the heated die 10 to the adhesive 34. The adhesive layer 40 continues to "shrink" or "contract" as the curing process proceeds. This places tension forces on the die 10 and substrate 30 and locks in the pressure initially applied to the die 10. Preferably the curing process is completed in from a few seconds to a minute.

A thickness of the cured adhesive layer 40 will be dependent on the dispensed volume of adhesive 34. A representative thickness for the adhesive layer 40 can be from 0.5 mils to 5 mils.

As the adhesive layer 40 cures, bonded connections 44 (FIG. 4B) form between the die 10 and the substrate 30. The bonded connections 44 comprise the contact bumps 12 on the die 10 and the contacts 32 on the substrate 30. The heated contact bumps 12 also heat the contacts 32 to provide energy for the bonding process. In addition, the tension forces provided by the adhesive layer 40 compresses the contact bumps 12 to the contacts 32. This compression loading contributes to the bonded connections 44 being low resistance or "ohmic" contacts. In addition, with the contacts 32 formed of an anisotropic adhesive, curing under compression forms a low resistance conductive path through the anisotropic adhesive. The contact bumps 12 on the die 10 can also be formed of a conductive elastomer, such as an anisotropic adhesive, such that curing can be performed with the contact bumps 12 under compression.

As shown in FIG. 4B, the completed electronic assembly 46 includes the die 10 bonded to the substrate 30 by the cured adhesive layer 40 and the bonded connections 44.

Figure 5:
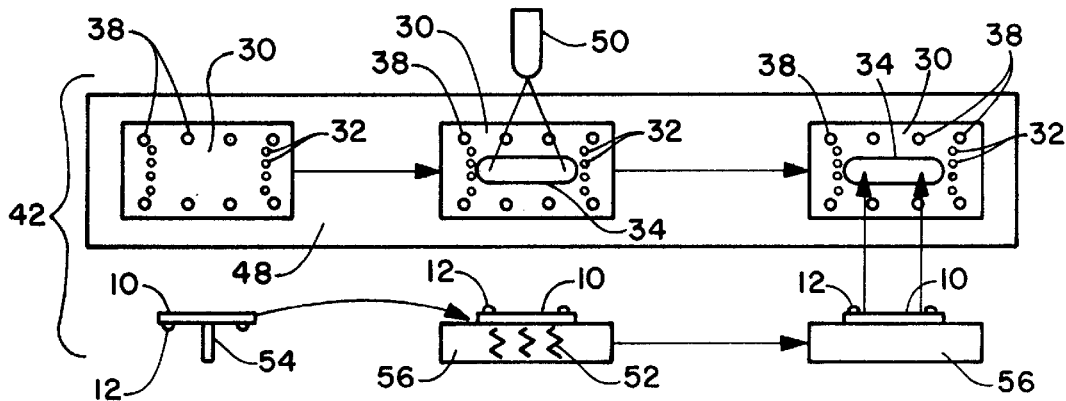
FIG. 5 is a schematic diagram of a system constructed in accordance with the invention.

Referring to FIG. 5, the system 42 for performing the above outlined method is shown. The system 42 includes: an indexing mechanism 48 configured to index and align substrates 30 with respect to dice 10; an adhesive dispensing mechanism 50 configured to dispense the instant curing adhesive 34 on the substrates 30; a die pick mechanism 54 configured to pick individual dice 10; a die heater 52 configured to heat the dice 10 to a temperature of between 200° C. to 300° C.; and a die support platform 56 configured as a pressing mechanism to press individual dice 10 against the substrates 30 with a desired pressure.

In the illustrative embodiment the system includes components of a conventional lead-on-chip die attacher modified to practice the method of the invention. One suitable LOC die attacher is manufactured by ESC Manufacturing Company, Warrington, Pa. and is designated an ESC Apollo 9200 LOC die attach system. This die attacher is configured to attach LOC dice to LOC leadframes.

The indexing mechanism 48 transfers individual substrates 30 from a magazine or other supply mechanism onto an indexing track. The indexing mechanism 48 can include pins configured to mate with the indexing openings 38 on the substrates 30. The indexing mechanism 48 permits an alignment of ±2 mils.

The adhesive dispensing mechanism 50 dispenses the adhesive 34 from a nozzle onto the substrates 30 in desired patterns. The adhesive 34 is initially in a viscous state but is formulated to snap cure upon contact with the heated die 10.

The die pick mechanism 54 picks singulated dice 10 from a wafer film frame, or other supply mechanism, and transfers the dice 10 to the die support platform 56. The die support platform 56 can include the die heater 52 which heats individual dice 10 by conduction to a temperature between about 100° C. to 300° C. In addition, the die support platform 56 functions as a pressing mechanism to press the individual dice 10 against the adhesive 34 with a desired pressure.

Thus the invention provides an improved method and system for attaching semiconductor dice to substrates such as printed circuit boards and multi chip modules. In addition, an improved electronic assembly is provided. Although the method of the invention has been described with reference to certain preferred embodiments, as will be apparent to those skilled in the art, certain changes and modifications can be made without departing from the scope of the invention as defined by the following claims.

I claim:

1. A method for attaching semiconductor dice to substrates comprising:

providing a substrate comprising contacts;

providing a bumped die comprising contact bumps;

providing an adhesive formulated to cure in from 0.25 seconds to 60 seconds;

heating the die;

dispensing a volume of the adhesive onto the substrate;

aligning the contact bumps with the contacts;

placing the die in contact with the adhesive on the substrate to form an adhesive layer therebetween; and curing the adhesive layer with heat from the die.

2. The method as claimed in claim 1 wherein the substrate comprises an element selected from the group consisting of printed circuit boards and multi chip modules.

3. The method as claimed in claim 1 wherein the contacts comprise a conductive elastomer.

4. The method as claimed in claim 1 further comprising providing a lead-on-chip die attacher and performing the heating, dispensing, aligning and placing steps with the die attacher.

5. A method for attaching semiconductor dice to substrates comprising:

providing a bumped die comprising solder contact bumps in a first pattern;

providing a substrate comprising raised contacts in a second pattern corresponding to the first pattern;

heating the die to a temperature between about 100° C. to 300° C.;

applying an adhesive to the substrate, said adhesive formulated to cure in from 0.25 seconds to 60 seconds;

aligning the contact bumps with the contacts;

placing the die in contact with the adhesive on the substrate; and curing the adhesive with heat from the die to form a cured adhesive layer between the die and substrate.

6. The method as claimed in claim 5 wherein the adhesive comprises a material selected from the group consisting of bismaleimide and cyanoacrylate.

7. The method as claimed in claim 5 wherein the adhesive comprises bismaleimide with a dielectric filler.

8. The method as claimed in claim 5 wherein the contacts comprise an anisotropic conductive adhesive.

9. The method as claimed in claim 5 wherein a pressure of from about 5 grams to 6 kilograms is applied during the applying step.

10. A method for attaching semiconductor dice to substrates comprising:

providing a bumped die having contact bumps comprising solder;

providing a substrate comprising a printed circuit board including a die mounting area having contacts thereon;

applying an adhesive to the die mounting area, said adhesive formulated to cure in from 0.25 seconds to 60 seconds;

heating the die to a temperature sufficient to soften the contact bumps;

placing the die on the die mounting area to form an adhesive layer therebetween; and curing the adhesive layer with heat from the die.

11. The method as claimed in claim 10 wherein the contacts comprise raised members.

12. The method as claimed in claim 10 wherein the contacts comprise metal pads.

13. The method as claimed in claim 10 wherein the contacts comprise an anisotropic conductive adhesive.

14. The method as claimed in claim 10 wherein the solder comprises a material selected from the group consisting of 95%Pb/5%Sn, 60%Pb/40%Sn, 63%In/37%Sn, 100%Sn, 62%Pb/36%Sn/2%Au, and 67%Ni/33%Pd.

15. A method for attaching semiconductor dice to substrates comprising:

providing a bumped die with contact bumps;

providing a substrate with contacts comprising an anisotropic conductive adhesive;

applying an adhesive to the substrate, said adhesive formulated to cure in from 0.25 seconds to 60 seconds;

heating the die;

aligning the contacts to the contact bumps;

placing the die on the die mounting area to form an adhesive layer and place a tension force on the die;

curing the adhesive layer with heat from the die; and curing the anisotropic adhesive under compression from the tension force.

16. The method as claimed in claim 15 wherein the contact bumps comprise a conductive elastomer.

17. The method as claimed in claim 15 wherein the contact bumps comprise an anisotropic conductive adhesive.

18. A method for attaching semiconductor dice to a substrate comprising:

providing a bumped die comprising contact bumps;

providing the substrate with contacts;

providing an adhesive formulated to cure in from 0.25 seconds to 60 seconds;

providing a lead-on-chip die attacher comprising an aligning mechanism for aligning the die and the substrate, a heater for heating the die, a dispensing mechanism for dispensing the adhesive, and a pressing mechanism for pressing the die against the substrate;

dispensing the adhesive on the substrate using the dispensing mechanism;

heating the die using the heater to a temperature between about 100° C. to 300° C.;

aligning the contact bumps with the contacts using the aligning mechanism;

pressing the die against the substrate with the adhesive therebetween using the pressing mechanism; and curing the adhesive with heat from the die.

19. The method as claimed in claim 18 further comprising providing the substrate with alignment openings and performing the aligning step using the alignment openings and aligning mechanism.

20. The method as claimed in claim 18 wherein the substrate comprises a printed circuit board.

21. The method as claimed in claim 18 wherein the substrate comprises a multi chip module.

22. A system for attaching semiconductor dice to substrates comprising:

an adhesive formulated to cure in from 0.25 seconds to 60 seconds;

a substrate comprising a die mounting area and a plurality of contacts;

a semiconductor die comprising a plurality of contact bumps;

a heating mechanism configured to heat the die;

a dispensing mechanism configured to dispense the adhesive on the die mounting area;

an alignment mechanism configured to align the contact bumps on the die and the contacts on the substrate; and a pressing mechanism configured to press the die following heating thereof, against the adhesive dispensed in the die mounting area, to form a cured adhesive layer between the die and the substrate.

23. The system as claimed in claim 22 wherein the heating mechanism, dispensing mechanism, alignment mechanism and pressing mechanism comprise components of a lead on chip die attacher.

24. The system as claimed in claim 22 wherein the substrate comprises an element selected from the group consisting of printed circuit boards and multi chip modules.

25. The system as claimed in claim 22 wherein the adhesive comprises a material selected from the group consisting of bismaleimide and cyanoacrylate.

26. The system as claimed in claim 22 wherein the adhesive comprises bismaleimide with a dielectric filler.

27. The system as claimed in claim 22 wherein the adhesive comprises electrically insulating balls.

28. A system for attaching a bumped semiconductor die to a printed circuit board having contacts, said system comprising:

an adhesive formulated to cure in from 0.25 seconds to 60 seconds;

a lead-on-chip die attacher comprising a heating mechanism configured to heat the die, a dispensing mechanism configured to dispense the adhesive on the board, an alignment mechanism configured to align the contact bumps to the contacts, and a pressing mechanism configured to press the die following heating thereof, against the adhesive in the die mounting area, to form a cured adhesive layer between the die and substrate.

29. The system as claimed in claim 28 wherein the board includes alignment openings operable in conjunction with the alignment mechanism.

30. The system as claimed in claim 28 wherein the adhesive comprises a material selected from the group consisting of bismaleimide and cyanoacrylate.

31. An electronic assembly comprising:

a substrate comprising a plurality of contacts;

a bumped semiconductor die comprising a plurality of contact bumps bonded to the contacts; and a cured adhesive layer formed between the die and the substrate, said cured adhesive layer comprising a material selected from the group consisting of bismaleimide and cyanoacrylate.

32. The assembly as claimed in claim 31 wherein the contacts comprise a conductive elastomer.

33. The assembly as claimed in claim 31 wherein the substrate comprises a printed circuit board.

34. The assembly as claimed in claim 31 wherein the substrate comprises a multi chip module.

* * * * *